(12) United States Patent
Pomar Garcia et al.

(10) Patent No.: US 7,508,187 B2
(45) Date of Patent: Mar. 24, 2009

(54) DEVICE AND SYSTEM FOR THE MEASUREMENT OF AN EXTERNAL ELECTROSTATIC FIELD, AND SYSTEM AND METHOD FOR THE DETECTION OF STORMS

(75) Inventors: Carlos Pomar Garcia, Paterna (ES); Jesus Puchades Marco, Paterna (ES)

(73) Assignee: Aplicaciones Tecnologicas, S.A., Paterna (ES)

( * ) Notice: Subject to any disclaimer, the term of this patent is extended or adjusted under 35 U.S.C. 154(b) by 55 days.

(21) Appl. No.: 11/666,193

(22) PCT Filed: Oct. 25, 2005

(86) PCT No.: PCT/ES2005/000573

§ 371 (c)(1), (2), (4) Date: Jun. 14, 2007

(87) PCT Pub. No.: WO2006/045873

PCT Pub. Date: May 4, 2006

(65) Prior Publication Data

US 2008/0088315 A1    Apr. 17, 2008

(30) Foreign Application Priority Data

Oct. 25, 2004    (ES)    ............... 200402545

(51) Int. Cl.
G01R 31/02    (2006.01)
G01R 29/12    (2006.01)
(52) U.S. Cl. ..................... 324/72; 324/457
(58) Field of Classification Search ........... 324/72, 324/457, 458, 713, 123 R, 530, 144, 76.11
See application file for complete search history.

(56) References Cited

U.S. PATENT DOCUMENTS 3,753,117 A    8/1973    Downing (Continued)

FOREIGN PATENT DOCUMENTS

EP    0252807    1/1988

(Continued)

OTHER PUBLICATIONS

International Preliminary Report on Patentability dated Mar. 12 for corresponding International Application PCT/ES2005/000573.

(Continued)

*Primary Examiner*—Vincent Q Nguyen
*Assistant Examiner*—Hoai-An D Nguyen
(74) *Attorney, Agent, or Firm*—Katten Muchin Rosenman LLP

(57) ABSTRACT

The invention relates to a device for the measurement of an external electrostatic field, for example, for the detection of storms, which includes a first conductive element (1); an amplifier (2) in charge configuration; an electronic control device (3) which has an input (3a) connectable to the output (2b) of the amplifier (2), to receive an output signal (Vs); and a second conductive element (4) located near to the first conductive element (1) to subject it to a compensating electrostatic field created by a compensating signal (Vc) calculated and generated by the electronic control device, to avoid a drift in the output signal (Vs) caused by the integrating character of the configuration of the amplifier. The invention also relates to a system for differential measurement, a system and method for the detection of storms.

11 Claims, 5 Drawing Sheets

U.S. PATENT DOCUMENTS

| | | | |
|---|---|---|---|
| 4,383,260 A | | 5/1983 | Ryan |
| 4,422,037 A | * | 12/1983 | Coleman .................... 324/72 |
| 4,642,559 A | | 2/1987 | Slough |
| 4,672,305 A | * | 6/1987 | Coleman .................... 324/72 |
| 4,841,304 A | | 6/1989 | Richard et al. |
| 4,901,564 A | * | 2/1990 | Williams et al. ......... 73/170.24 |
| 5,296,842 A | * | 3/1994 | Kato ........................ 340/601 |
| 5,315,232 A | * | 5/1994 | Stewart .................... 324/72 |
| 6,353,324 B1 | | 3/2002 | Uber |
| 6,414,318 B1 | | 7/2002 | Uber |
| 7,109,698 B2 | * | 9/2006 | Swenson et al. .............. 324/72 |

FOREIGN PATENT DOCUMENTS

| | | |
|---|---|---|
| ES | 2030747 | 11/1992 |
| ES | 2038551 | 7/1993 |
| FR | 2432719 | 2/1980 |
| FR | 2 602 342 | 2/1988 |
| FR | 2038551 | 7/1993 |
| JP | 2002-529742 | 9/2002 |

OTHER PUBLICATIONS

International Search Report dated Mar. 1, 2006 for corresponding International Application PCT/ES2005/000573.

* cited by examiner

DEVICE AND SYSTEM FOR THE MEASUREMENT OF AN EXTERNAL ELECTROSTATIC FIELD, AND SYSTEM AND METHOD FOR THE DETECTION OF STORMS This application is a National Phase Application of International Application No. PCT/ES2005/000573, filed Oct. 25, 2005, which claims the benefit under 35 U.S.C. 119 (a-e) of Spanish Application No. P200402545 filed Oct. 25, 2004, which is herein incorporated by reference.

TECHNICAL FIELD OF THE INVENTION

The invention is included in the field of the systems for measurement of the electrostatic field, useful for, for example, the detection of storms.

BACKGROUND OF THE INVENTION

At the present time basically three different methods are used for the detection of storms:
a) Detection by ionisation of the air or corona effect.
b) Detection by radiofrequency.
c) Detection by measurement of the electrostatic field.
The basic operating principle of each of these detection methods is described hereunder.
a) Storm detector by ionisation of the air or corona effect.
A detector of this type is described in the Spanish patent application published under the number ES-A-2038551.
This type of detectors act by measuring the current produced by the variations of electric field caused by the storms and, more specifically, the abrupt variations which take place moments before lightning strikes. The main drawback with this type of detector is that they only detect abrupt variations of the field, for which reason its forewarning time of the storm is almost nil, since they only detect the activity of the storm when the latter is over the actual detector.
b) Storm detector by radiofrequency.
An example of a detector of this type is described in the European patent EP-B-0252807 (the translation of which into Spanish has been published under the number ES-T-2030747).
The radiofrequency detectors detect the radiofrequency emissions which the lightning emits when passing through the atmosphere from the cloud to the ground. The detectors of this type, although they are very effective for detecting storms at long distance, have one drawback: they are unable to detect storms that are in formation just above the detector itself since they only detect the storm when this has a considerable electric activity.
c) Storm detector by measurement of the electrostatic field.
It is the only detector capable of continuously measuring the electrostatic field, for which reason it can measure the small variations or increments in the electrostatic field produced both by the approach of a storm and by the creation of the latter over the detector itself. The main drawback of this type of detector is not in the method of detection but in the detection instruments that are used at the present time. These instruments, for example that described in the French patent application published under the number FR-A-2432719, are based on the principle of the field mill. The instrument described in FR-A-2432719 uses a mechanical motor to transform the electrostatic field into an alternating signal, which is much easier to measure. The use of a motor implies a drawback, since when using moving parts, there is the risk of breakdown and wear (especially if it is kept in mind that this type of instrument often has to be working 24 hours a day, 365 days a year).

For this reason, it has been considered that it would be desirable to provide a device or system useful for measuring the electrostatic field and which does not have this type of moving elements.

DESCRIPTION OF THE INVENTION

A first aspect of the invention relates to a device for measurement of an external electrostatic field, which comprises:
a first conductive element (for example, a metallic disk of copper of approximately 20 mm in diameter and 0.2 mm in thickness;
an amplifier (for example, an electrometric operational amplifier which is able to amplify very small currents) with an input connected to the first conductive element to receive an input signal (Ve) in said input, said signal being indicative of the value (voltage or potential) (with respect to earth, if the other input of the amplifier is connected to earth) of the electrostatic field to which the first conductive element is subjected (the field voltage is measured, specifically the volts per meter), the amplifier being configured as charge amplifier (also termed integrating amplifier; in this way, a high gain is achieved and, at the same time, almost zero leakage currents, if compared with a differential configuration of the amplifier) (what characterizes a charge amplifier is that the feedback loop of the operational amplifier is constituted by a capacitor and not by a resistance; the capacitor presents an almost infinite impedance, of the order of Tera-ohms, for dc voltages and/or currents) so that it produces, in an output of the amplifier, an output signal (Vs) with a value which corresponds to the value of the input signal (Ve) integrated over time;
an electronic control device (for example, a microcontroller) which has an input connectable (or connected) to the output of the amplifier, to receive said output signal (Vs) (or a digitised signal corresponding to the same).

However, the amplifier in charge configuration has one problem. In an amplifier in differential configuration (see FIG. 1B), with a resistance $R_1$ connected between the negative input and an input signal (voltage) Ve, and with a resistance $R_2$ connected between the output and the input, the resulting output signal Vs is related with the input signal by the formula $$Vs = -Ve \times (R_1/R_2),$$

that is, the output signal Vs is proportional to the input signal Ve and if Ve does not vary with time, nor does Vs vary. Now, for the detection of storms and similar applications, the detection of the electrostatic field with an amplifier in differential configuration would not be practical, as leaks take place for the resistances utilized; since the charges to detect are usually very small, these leaks would render any detection impossible (since the leaks can be greater than the current produced by the electrostatic field).

For this reason, the charge or integrating configuration has been chosen, represented in FIG. 1A, wherein the relationship between the output signal Vs and the input signal, using a capacitor C, is defined by the formula $$Vs = -1/C \times \int Ve \, dt$$

that is, the output signal would correspond to the input signal integrated over time. This means that for a constant input, the output tends to infinity, that is, it gradually rises or falls, making any measurement impossible.

For this reason, in accordance with the invention, a second conductive element has been foreseen located near to the first conductive element, and the electronic control device having an output connectable (or connected) to said second conductive element in order to apply a compensating voltage (Vc) to said second conductive element, to establish a compensating electrostatic field that affects the first conductive element.

In accordance with the invention, the electronic control device also comprises:

means to detect the output signal (Vs) of the amplifier;

means to periodically measure a variation in time of said output signal (Vs);

means to generate and apply periodically to the output of the electronic control device, the compensating signal or voltage (Vc) with an equivalent value and with opposite polarity to the variation with time detected in the output signal (Vs) of the amplifier, with the condition that if said variation with time is greater than a maximum value (Vcmax), the value of the compensating voltage will be equal to said maximum value (Vcmax).

In this way, what is achieved is to generate, through the second conductive element (near to the first conductive element), an additional component of the electrostatic field that affects the first conductive element, and which "compensates" or reduces the input signal Ve in terms of the variation detected in the output signal, thereby avoiding the effect of the integration or "drift" in the output signal, without affecting the leakage currents of the amplifier itself (since the first conductive element and the second conductive element are near each other, but without being in contact).

Logically, the maximum levels of the compensating signal Vc, as well as the frequency at which it is applied, are chosen adequately so that the compensating signal can "compensate" the drift that takes place in the amplifier for the aforesaid reasons, but without it being able to hide variations in the output signal that are due to substantial changes in the external electrostatic field which it is desired to measure. This is possible because, in the practical applications, the variations in the external field are much greater or "more abrupt" than those represented by the drift in the amplifier.

The electronic control device can, therefore, be configured so that the rate of producing the compensating signal and the maximum value of the compensating signal (Vc) are limited so that the compensating signal can compensate a drift in the output signal (Vs) due to the integration of the input signal (Ve) in the amplifier, but not changes in the output signal which are due to (substantial) variations in the external electrostatic field to be measured.

For example, the electronic control device can be configured so that the compensating signal (Vc) is produced once every S seconds: $0.1s \leq S \leq 1s$, for example, $0.2s \leq S \leq 0.6$, for example, S=500 ms, and the maximum value of the voltage or compensating signal (Vc) can be limited so that the compensating signal applied to the second conductive element (4) cannot exceed 200 mV.

The device can include a first analogue-to-digital converter to convert the output signal (Vs) of the amplifier into a digital signal to be processed by the electronic control device, and/or a digital-to-analogue converter to convert the digital compensating signal of the electronic control device, into an analogue voltage that is applied to the second conductive element.

Another aspect of the invention relates to a system for measuring an external electrostatic field by differential measurement, and which comprises two devices in accordance with what has been described above, as well as means to detect the difference between the output signal (Vs) of one of said devices and the output signal (Vs) of another of said devices. In this way, the first conductive elements of both devices can be placed one next to the other but separated in one direction, for example, in the vertical direction, so that one of the conductive elements is at a certain distance (for example, a centimeter) above the other. In this way, the difference between the output signals (Vs) of both devices represents a direct measurement of the mean field voltage (in the case of a distance of separation of one centimeter, the mean field voltage percentimeter). In this way, a differential measurement is obtained between two points separated by a fixed distance, whereby the measurement is no longer with reference to the ground (earth). In this way, the measurements are not influenced by the distance from the ground (the height) of the devices (of the first conductive elements), for which reason the necessity is avoided of incorporating complicated calibration systems, which would have to be adjusted in terms of the height of the installation. In the system, a given electronic module (for example, a microcontroller) can perform the function of electronic control device of both measurement devices which incorporate the system, and also carry out the function of producing the indicative signal of the difference between the two output signals of the amplifiers of the measurement devices.

The system of the invention can comprise a computer system configured to receive an indicative signal of the difference between the output signals (Vs) and produce an indicative signal of an event should said difference fulfil one or more predetermined criteria (for example, criteria that have been considered indicative of a storm). The computer system itself can materialize the means to detect or to calculate the difference between the output signals of the two measurement devices.

The first conductive element of one of the devices can be located in the vicinity of the first conductive element of another of the devices, one of said conductive elements being located at a height above that of the other (for example, of the order of one centimeter above the other).

Another aspect of the invention relates to a system for the detection of storms, which comprises at least one measurement device in accordance with what has been described above, as well as means of analysis (for example, implemented in a computer system) of the output signal (Vs) of said device or of said devices, said means of analysis being configured to produce a signal indicative of a storm when the output signal or the output signals fulfil at least one predetermined criterion.

The system for the detection of storms can comprise not only one measurement device but, for example, two, for example, a measurement system in accordance with what has been described above.

Another aspect of the invention relates to a method for detection of storms, which comprises the steps of:

monitoring the output signal (Vs) of a measurement device (or the difference between the output signals (Vs) of two devices of a measurement system) in accordance with what has been described above; and determining the presence of a storm based on the development of said output signal (or difference).

The electronic device for measuring electrostatic field of the invention, has the advantages of the detection method by measuring electrostatic field known from the FR-A-2432719, but having eliminated the inconvenience of using mechanical or moving parts, thereby achieving a very substantial reduction in size and cost of the device and using, instead of the moving elements, purely electronic sensors capable of measuring the electrostatic field directly, without needing to transform it into alternating signals.

Furthermore, having no elements that support mechanical wear, the useful life of the device/system is increased and the possibilities of faults occurring are greatly diminished, as is the need to carry out periodic maintenance.

Another of the advantages of using electronic sensors is the fact that these sensors, in contrast to the sensors with mechanical systems, do not alter the field in their surroundings, so that several sensors can be mounted separated by very short distances, such as has been described above. Based on this possibility, sensors can be mounted at different heights so that it is possible to measure a differential field voltage and in this way directly obtain the value of the mean field voltage without it affecting the height at which the measuring device or system is located.

DESCRIPTION OF THE DRAWINGS

To supplement the description that is being made and with the object of assisting in a better understanding of the characteristics of the invention, in accordance with a preferred example of practical embodiment thereof, attached as an integral part of said description, is a set of drawings wherein by way of illustration and not restrictively, the following has been represented.

PREFERRED EMBODIMENT OF THE INVENTION

Figure 1A:
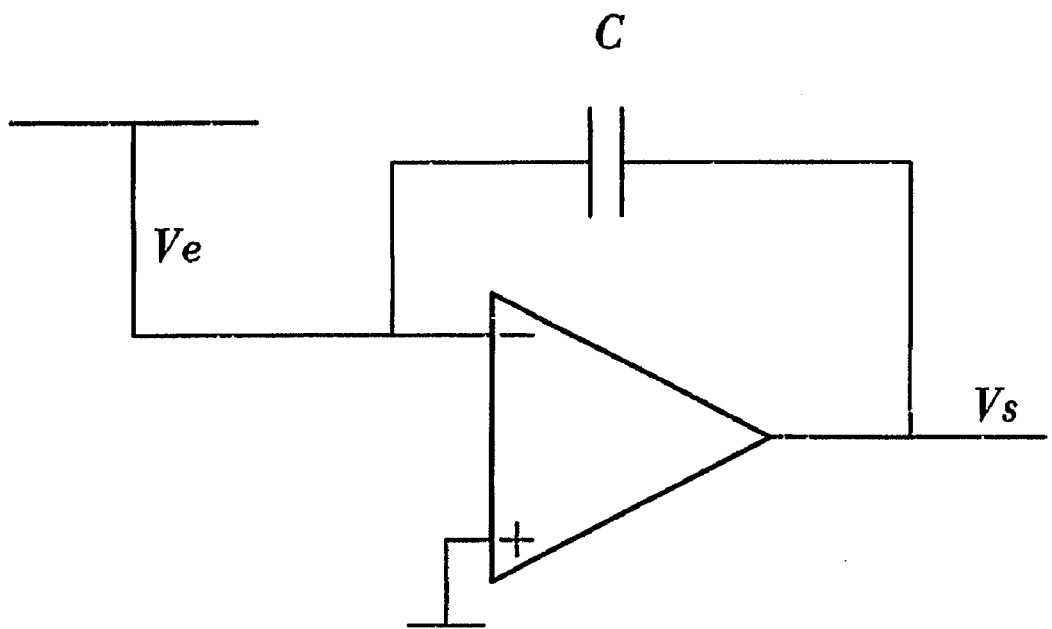
FIG. 1A reflects an amplifier in charge configuration (in accordance with the state of the art).
Figure 1B:
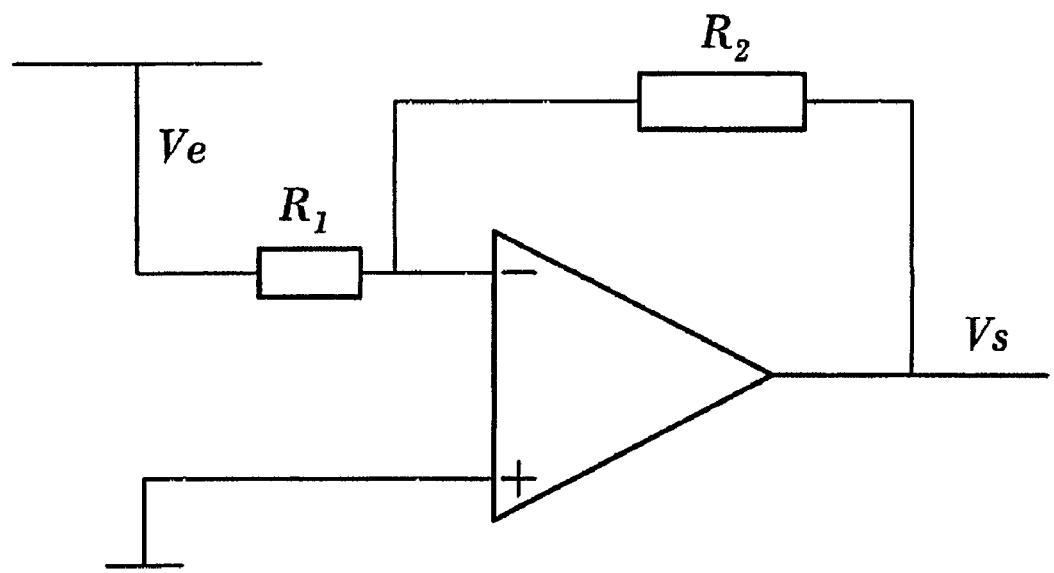
FIG. 1B reflects an amplifier in differential configuration (in accordance with the state of the art).
Figure 2:
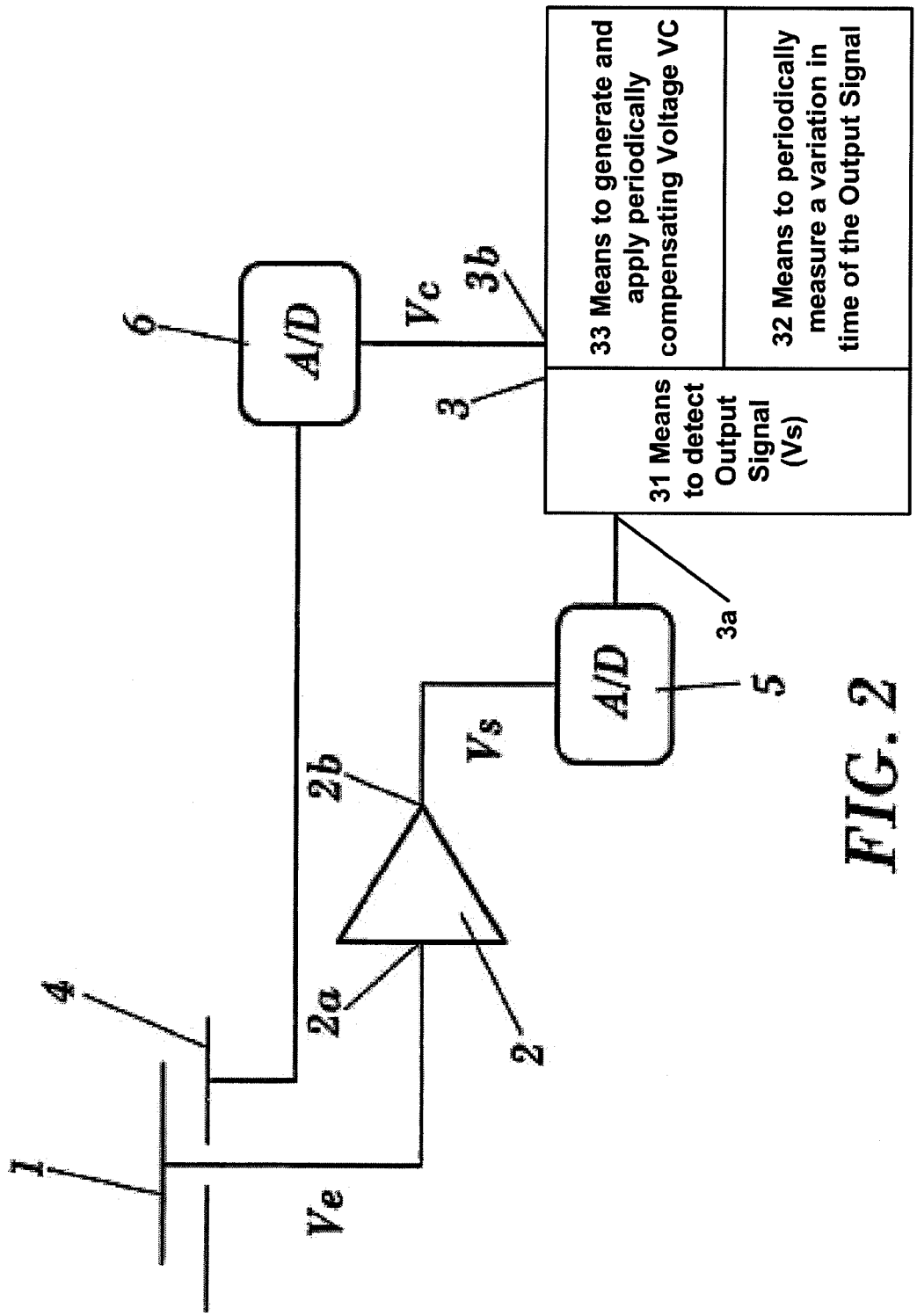
FIG. 2 reflects, in schematic terms, a measurement device in accordance with a preferred embodiment of the invention.

FIG. 2 reflects a measurement device in accordance with a preferred embodiment of the invention, suitable for detection of the electrostatic field to detect the presence or formation of storms. As one can observe, the device includes a first conductive element 1 which can consist of a metallic disk made, for example, of copper and with a diameter of approximately 20 mm. Said disk is connected to the negative input $2a$ of an electrometric operational amplifier configured as charge amplifier, that is, with a configuration like that of FIG. 1A. To be able to detect the small charges which the electrostatic field produces in the conductive element 1 (and which increase substantially in the presence of a storm, but without ceasing to be "small" in comparison with the leakage currents present in an amplifier in differential configuration), it has been chosen to use an electrometric operational amplifier (for example, LMC6462 and LMC6446 of NATIONAL SEMICONDUCTOR or the OPA128 of BURR-BROWN (Texas Instruments). In this way, high gains are achieved at the same time that the leakage currents are reduced (almost nil).

Thus, an input voltage or signal Ve at the input $2a$ of the amplifier produces an output signal Vs at the output $2b$ of the amplifier, which signal is converted from analogue format to digital format through the analogue-to-digital converter 5, to be then applied to an input $3a$ of the electronic control device 2, which measures this signal and which can produce an output signal indicative of the value of the signal Vs.

Now, in principle, with these elements it would be possible to obtain an output signal related with the input signal Ve. However, due to the integrating character of the amplifier in charge configuration, as has been described above, if no compensating signal were available, a drift would take place in the output signal Vs. Specifically, as is illustrated schematically in FIG. 3A, which reflects the development of the external electrostatic field that it is desired to measure Vm (which is measured in V/m) (and which contributes directly to the input voltage Ve) and the output signal Vs in time (t), when an increase (100) occurs in the external electrostatic field Vm, a corresponding increase would take place in the output signal Vs (area 101 in FIG. 3A). However, when the external electrostatic field is stabilized (200) at a high level, what is required is that the output signal Vs is also stabilized (as suggested by the portion 201 in FIG. 3A). However, due to the integrating character of the amplifier, the output signal Vs will be proportional to the integrated value of the input signal Ve (which, in this case, would depend directly on the value of the electrostatic field Vm), whereby the output signal will continue to increase (202), toward infinity (or to the limit of the amplifier's capacity), for which reason what can be termed a "drift" 300 is produced between the "real" value of the output signal Vs and the "desirable" value of the output signal (that is, the value that could clearly have a relationship with the value of the electrostatic field it is desired to measure Vm).

To avoid (or, at least, to reduce) this problem, the device of FIG. 2 is fitted with a second conductive element 4 which is connected to an output $3b$ of the electronic control device. Through said output $3b$, the electronic control device can apply a compensating signal or voltage Vc (through a digital-to-analogue converter which converts the compensation digital signal Vc produced by the electronic control device 3, into an analogue compensating signal or voltage Vc that is applied to the second conductive element 4).

In FIG. 2 it has been shown schematically how the electronic control device 3 comprises:

means 31 to detect the output signal (Vs) of the amplifier 2 (through the analogue-to-digital converter 5);

means 32 to periodically measure a variation in time of said output signal; and means 33 to generate and apply periodically to the output (3b) of the electronic control device (3), the compensating voltage (Vc) with an equivalent value and with opposite polarity to the variation with time detected in the output signal (Vs) of the amplifier, with the condition that if said variation with time is greater than a maximum value (Vcmax), the value of the compensating voltage will be equal to said maximum value (Vcmax).

Figure 3A:
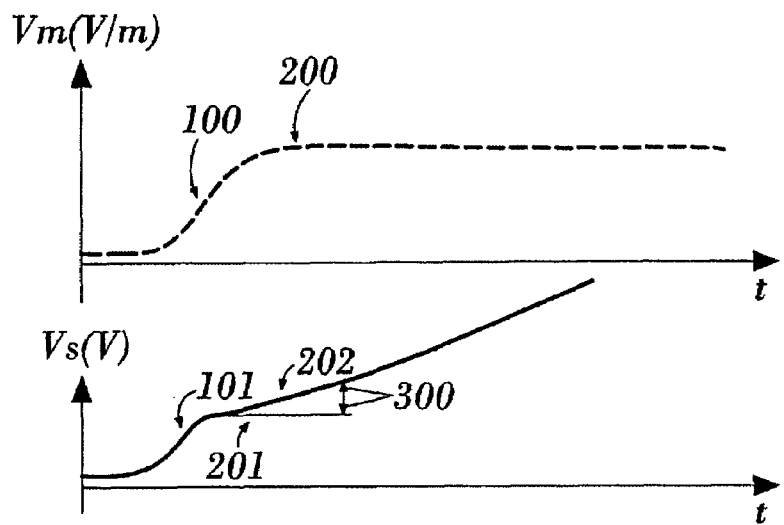
FIG. 3A reflects the temporal development of some of the pertinent signals in the event of not having the compensating signal.
Figure 3B:
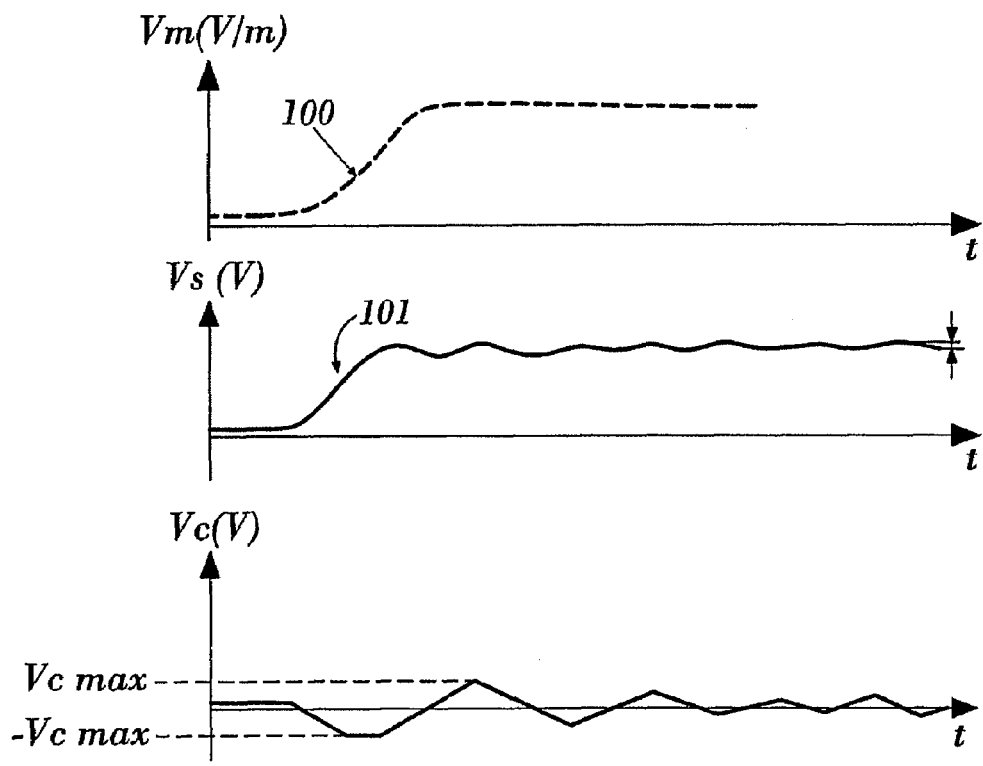
FIG. 3B reflects the development of these signals in the event of having a compensating signal.

FIG. 3B reflects in schematic terms the development in time (t) of the external electrostatic field Vm, of the output signal Vs and of the compensating voltage Vc. As has been illustrated schematically, in response to a change in the external electrostatic field Vm, a change takes place in the output signal Vs and, in terms of the change in the output signal, a change with a corresponding value but of opposite sign in the compensating voltage Vc which is applied to the second conductive element 4 and which, together with the external electrostatic field Vm, defines the current value of the input signal Ve. In this way, a drift in one direction in the output signal Vs causes a change in the compensating voltage Vc, which alters the electrostatic field produced by the second conductive element 4, so that it varies the total electrostatic field to which the first conductive element 1 is subjected. The application of a compensating voltage is repeated periodically and always in terms of the development of the output signal Vs, so that said signal oscillates slightly (as shown in FIG. 3B) but without having the constant drift that was observed in FIG. 3A.

However, the limitation to a maximum (Vcmax) of the absolute value of the compensating signal or voltage Vc, means the "compensation" can serve to compensate the slow drift (and relatively small, if we envisage a short period of time) which is due to the integrating character of the amplifier, but not for compensating greater changes like those which are due to a substantial variation in the external electrostatic field, which variation can be caused by the presence of a storm. In this way, even with the application of the compensation Vc, the output signal in FIG. 3B reflects (area 101) the increase (area 100) in the external electrostatic field.

(FIGS. 3A and 3B only reflect the signals in schematic terms and the scales and relationship between the amplitude of the signals in FIGS. 3A and 3B are not intended to reflect real values).

The second conductive element 4 can be of the same material and of the same dimensions as the first conductive element 1 and be located below this, at a small distance, for example, of the order of 1 mm. The application of a new compensating voltage can be produced with sufficient frequency, for example, 4 times per second, and the maximum value of the compensating voltage Vcmax can be of the order of 200 mV.

In this way, it is possible to measure the field voltage both when it is stable and when it varies.

Figure 4:
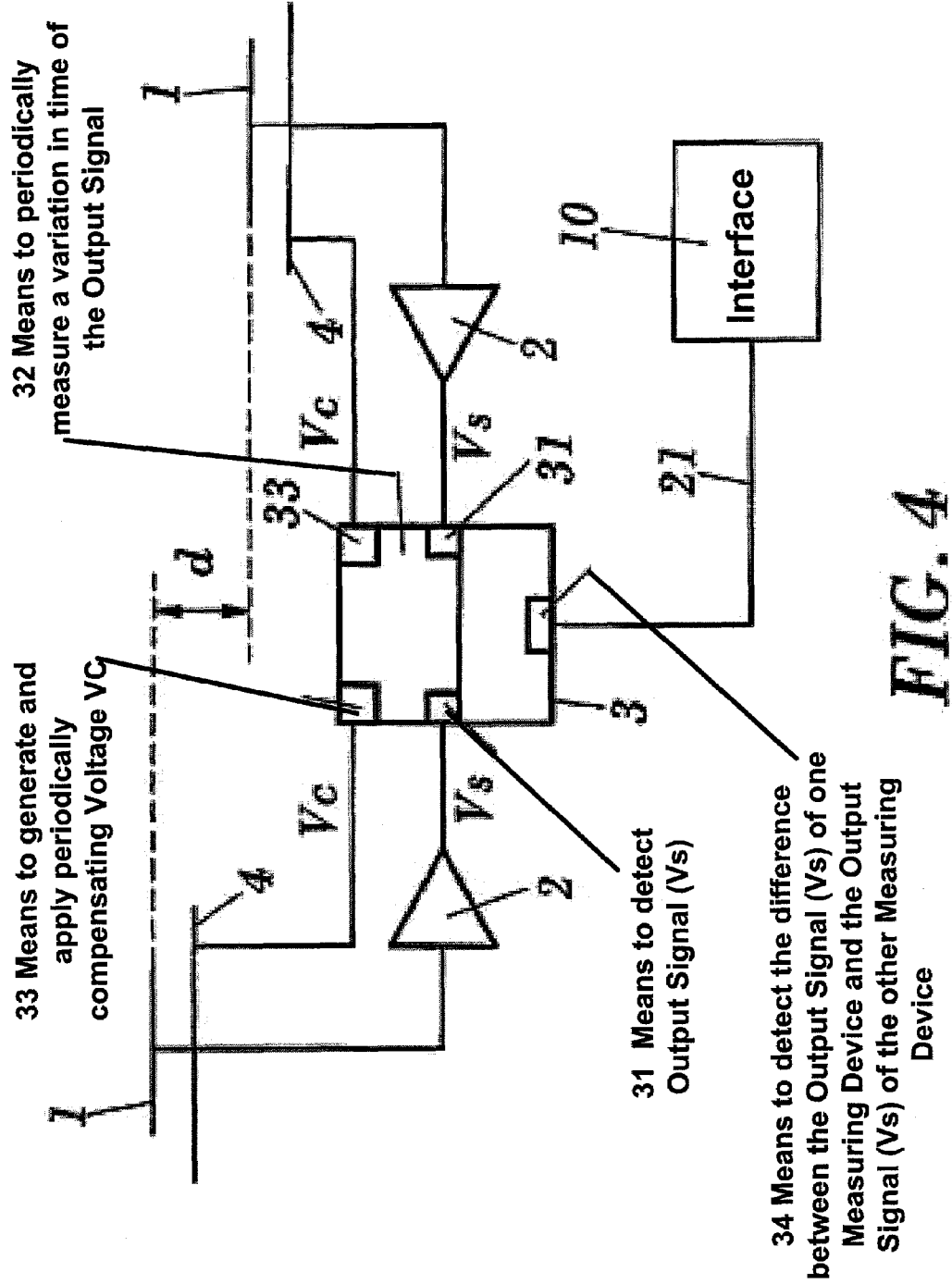
FIG. 4 reflects a system in accordance with a preferred embodiment of the invention, for the differential measurement of the external electrostatic field.

FIG. 4 reflects a system for the differential measurement of the electrostatic field in accordance with a preferred embodiment of the invention. The system includes, basically, two devices in accordance with what has been described above, each with a first conductive element 1, a second conductive element 4, and an amplifier 2. These elements are mounted and interrelated in the same way as in the measuring device described above and it can be considered that the system includes two of these measuring devices, although the function of both electronic control devices 3 is incorporated in a single instrument which, in addition, is equipped with means 34 to detect the difference between the output signal (Vs) of one of said measuring devices and the output signal (Vs) of the other of said measuring devices, and to deliver information on said difference to an interface 10 (for example, through a cable 21) so that the information can be transmitted to other instruments which can be part of a storm-monitoring facility or similar.

To obtain a value directly of, for example, the external electrostatic field in V/cm, one of the first conductive elements can be placed at a distance d (for example, one centimeter) above the other, in which case the difference between the two output signals (in V) directly represents the value (in V/m) of the external electrostatic field.

In this way, the system of FIG. 4 can be easily installed, in any place, and it will give a value indicative of the external electrostatic field, with no need to carry out calibrations related with the height of the facility.

Figure 5:
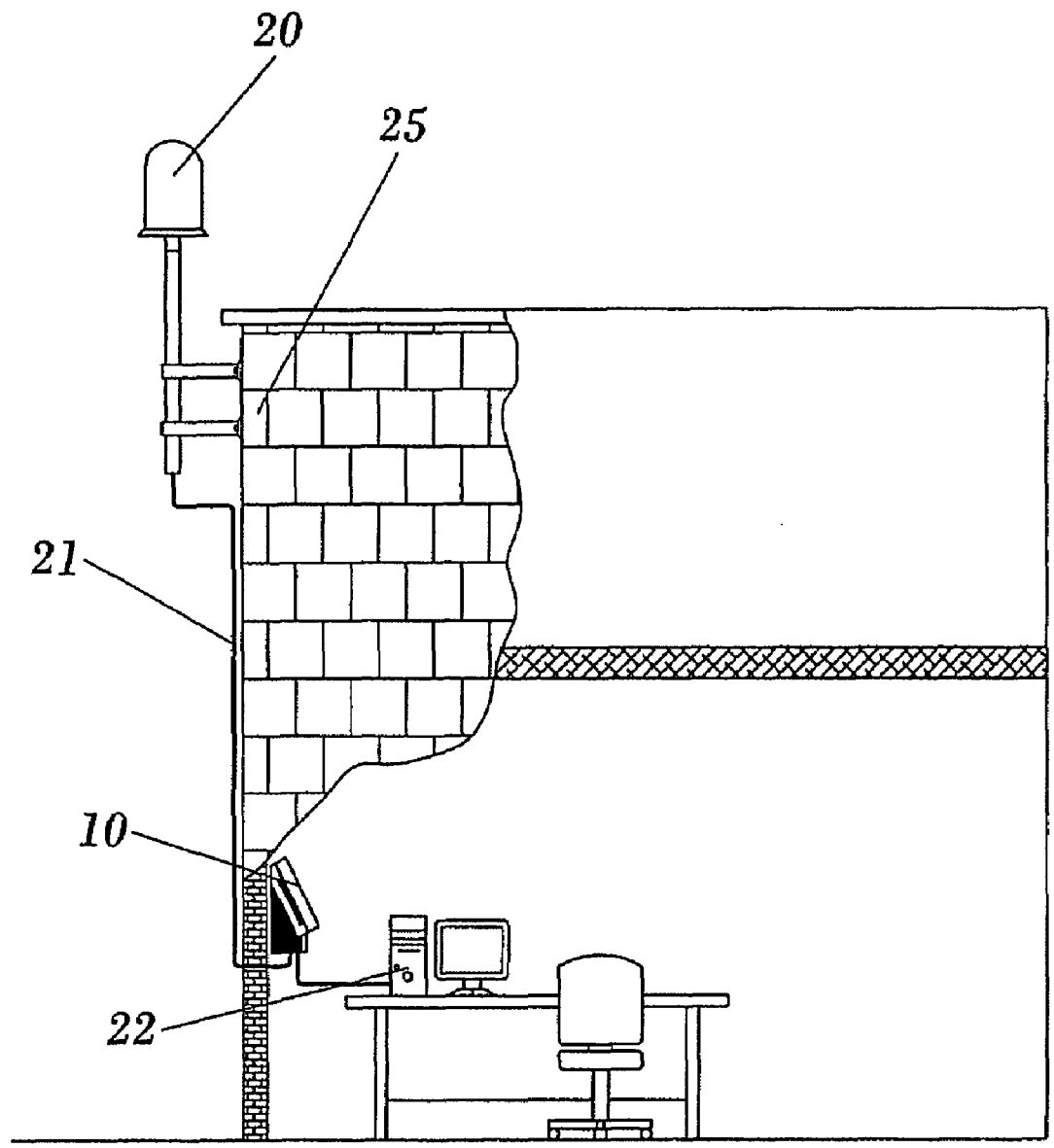
FIG. 5 reflects, in schematic terms, an installation which includes a system in accordance with FIG. 4.

In FIG. 5 it is shown how a system like that of FIG. 4 has been installed in a bolster 20, on a wall 25 of a building; the cable 21 connects the system with the user interface 10, through which the user can manipulate and analyse the output signal from the bolster, or connect the system with his personal computer 22 or with another computer system, to analyse the output signal from the bolster 20 (which signal corresponds to the difference between the two output signals Vs from each of the two measuring devices which incorporate the measurement system of FIG. 4). The interface 10 or the personal computer 22 can be equipped with a system which allows the received signal to be compared with certain criteria and, in the event that the signal complies with one or several of said criteria, produce a signal indicative of an event (for example, of a storm). In this version, with the cable 21 installed, said cable can also serve for the power supply of the system on the bolster 20.

It is also possible to suppress the cable 21, in which case the system on the bolster can communicate with the interface 10 by radiofrequency. For this, the system on the bolster can be connected to a radiofrequency communications module which can be connected to the electrical mains (and, therefore, provide electric power to the measurement system) or to an independent source of supply, for example, to a solar panel and a feed battery, in which case the radiofrequency communications module and the measurement system do not require any physical connection with the electric mains.

The interface 10 can be an intelligent interface and have software that allows analysing the signal that it receives from the measurement system. Alternatively or in addition, the interface can be connected to a computer 22 or similar which can carry out the analysis or part of the analysis.

Both the measurement device and the system described above allow the detection of storms. The method would consist, basically, in analysing the output signal Vs of the device (or the difference between the two output signals Vs of the devices that incorporate the system), to compare said signals or the development thereof with one or more criteria, and, as a result of the comparison, determine whether a storm has been detected or not. Using a computer with appropriate software, the signals that are provided by the device or system can be subjected to an advanced analysis (on the other hand, the electronic control devices 3 which form part of the device or measurement system can be simple, since they only have to receive and transmit the output signal and to calculate and produce the compensating signal Vc).

In this text, the word "comprises" and its variants (such as "comprising", etc.) are not to be interpreted in exclusive terms, that is, they do not exclude the possibility of that described including other elements, steps etc.

Furthermore, the invention is not restricted to the specific embodiments which have been disclosed but also include, for example, the variants which can be embodied by an expert skilled in the matter (for example, with regard to the choice of materials, dimensions, components, configuration, etc.), within what can be deduced from the claims.

The invention claimed is:

1. A device for measuring an external electrostatic field, device comprising:

a first conductive element (1);

an amplifier (2) with an input (2a) connected to the first conductive element (1) to receive an input signal (Ve) in said input (2a), said signal being indicative of the field voltage of an electrostatic field to which the first conductive element (1) is exposed, the amplifier (2) being configured as charge amplifier so that it produces, at one output (2b) of the amplifier (2), an output signal (Vs) with a value which corresponds to the value of the input signal (Ve) integrated over time;

an electronic control device (3) which has an input (3a) connected to the output (2b) of the amplifier (2), to receive said output signal (Vs);

a second conductive element (4) located near to the first conductive element (1);

the electronic control device having an output (3b) connected to said second conductive element (4) in order to apply a compensating voltage (Vc) to said second conductive element (4), to establish a compensating electrostatic field that affects the first conductive element (1);

the electronic control device further comprising:

means (31) to detect the output signal (Vs) of the amplifier;

means (32) for measuring a variation in time of said output signal (Vs) of the amplifier at regular time intervals;

means (33) to generate and apply periodically to the output (3b) of the electronic control device (3), the compensating voltage (Vc) with an equivalent value and with opposite polarity to the variation with time detected in the output signal (Vs) of the amplifier (2), with the condition that if said variation with time is greater than a maximum value (Vcmax), the value of the compensating voltage will be equal to said maximum value (Vcmax).

2. The device according to claim 1, wherein the electronic control device is configured so that the rate of producing the compensating voltage and the maximum value of the compensating voltage (Vc) are limited so that the compensating signal can compensate a drift in the output signal (Vs) due to the integration of the input signal (Ve) in the amplifier (2), but not changes in the output signal (Vs) which are due to substantial variations in the external electrostatic field to be measured.

3. The device according to claim 1, wherein the electronic control device (3) is configured so that the compensating voltage (Vc) is produced once every S seconds, $0.1s<S<1s$, and the maximum value (Vcmax) of the compensating voltage (Vc) is limited so that the compensating voltage applied to the second conductive element (4) cannot exceed 200 mV.

4. The device according to claim 1, wherein the device further includes a first analogue-to-digital converter (5) to convert the output signal (Vs) of the amplifier (2) into a digital signal to be processed by the electronic control device (3).

5. The device according to claim 1, wherein the device further includes a digital-to-analogue converter (6) to convert a digital compensating signal (Vc) of the electronic control device (3) into the analogue compensating voltage (Vc) which is applied to the second conductive element (4).

6. A system for measuring an electrostatic field by differential measurement, comprising:

two devices and means (34) to detect the difference between the output signal (Vs) of one of said devices and the output signal (Vs) of another of said devices, wherein each device comprises a first conductive element (1);

an amplifier (2) with an input (2a) connected to the first conductive element (1) to receive an input signal (Ve) in said input (2a), said signal being indicative of the field voltage of an electrostatic field to which the first conductive element (1) is exposed, the amplifier (2) being configured as charge amplifier so that it produces, at one output (2b) of the amplifier (2), an output signal (Vs) with a value which corresponds to the value of the input signal (Ve) integrated over time;

an electronic control device (3) which has an input (3a) connected to the output (2b) of the amplifier (2), to receive said output signal (Vs);

a second conductive element (4) located near to the first conductive element (1);

the electronic control device having an output (3b) connected to said second conductive element (4) in order to apply a compensating voltage (Vc) to said second conductive element (4), to establish a compensating electrostatic field that affects the first conductive element (1);

the electronic control device further comprising:

means (31) to detect the output signal (Vs) of the amplifier;

means (32) for measuring a variation in time of said output signal (Vs) of the amplifier at regular time intervals;

means (33) to generate and apply periodically to the output (3b) of the electronic control device (3), the compensating voltage (Vc) with an equivalent value and with opposite polarity to the variation with time detected in the output signal (Vs) of the amplifier (2), with the condition that if said variation with time is greater than a maximum value (Vcmax), the value of the compensating voltage will be equal to said maximum value (Vcmax).

7. The system for measuring according to claim 6, wherein the system additionally comprises a computer system (10; 22) configured to receive a signal indicative of the difference between the output signals (Vs) and produce a signal indicative of an event should said difference fulfil one or more predetermined criteria.

8. The system for measuring according to claim 7, wherein the first conductive element (1) of one of the devices is located in the vicinity of the first conductive element (1) of another of the devices, one of said first conductive elements being located at a height above that of the other.

9. System The system for the detection of storms, comprising:

at least one device and means of analysis (10, 22) of the output signal (Vs) of said device or of said devices, said means of analysis being configured to produce a signal indicative of a storm when the output signal or the output signals fulfill at least one predetermined criterion, wherein the at least one device comprises a first conductive element (1);

an amplifier (2) with an input (2a) connected to the first conductive element (1) to receive an input signal (Ve) in said input (2a), said signal being indicative of the field voltage of an electrostatic field to which the first conductive element (1) is exposed, the amplifier (2) being configured as charge amplifier so that it produces, at one output (2b) of the amplifier (2), an output signal (Vs) with a value which corresponds to the value of the input signal (Ve) integrated over time;

an electronic control device (3) which has an input (3a) connected to the output (2b) of the amplifier (2), to receive said output signal (Vs);

a second conductive element (4) located near to the first conductive element (1);

the electronic control device having an output (3b) connected to said second conductive element (4) in order to apply a compensating voltage (Vc) to said second conductive element (4), to establish a compensating electrostatic field that affects the first conductive element (1);

the electronic control device further comprising:

means (31) to detect the output signal (Vs) of the amplifier;

means (32) for measuring a variation in time of said output signal (Vs) of the amplifier at regular time intervals;

means (33) to generate and apply periodically to the output (3b) of the electronic control device (3), the compensating voltage (Vc) with an equivalent value and with opposite polarity to the variation with time detected in the output signal (Vs) of the amplifier (2), with the condition that if said variation with time is greater than a maximum value (Vcmax), the value of the compensating voltage will be equal to said maximum value (Vcmax).

10. A method for the detection of storms comprising the steps of:

monitoring the difference between the output signal (Vs) of two devices of a measurement system; and determining the presence of a storm based on the development of said differences, wherein each device comprises a first conductive element (1);

an amplifier (2) with an input (2*a*) connected to the first conductive element (1) to receive an input signal (Ve) in said input (2*a*), said signal being indicative of the field voltage of an electrostatic field to which the first conductive element (1) is exposed, the amplifier (2) being configured as charge amplifier so that it produces, at one output (2*b*) of the amplifier (2), an output signal (Vs) with a value which corresponds to the value of the input signal (Ve) integrated over time;

an electronic control device (3) which has an input (3*a*) connected to the output (2*b*) of the amplifier (2), to receive said output signal (Vs);

a second conductive element (4) located near to the first conductive element (1);

the electronic control device having an output (3*b*) connected to said second conductive element (4) in order to apply a compensating voltage (Vc) to said second conductive element (4), to establish a compensating electrostatic field that affects the first conductive element (1);

the electronic control device further comprising:

means (31) to detect the output signal (Vs) of the amplifier;

means (32) for measuring a variation in time of said output signal (Vs) of the amplifier at regular time intervals;

means (33) to generate and apply periodically to the output (3*b*) of the electronic control device (3), the compensating voltage (Vc) with an equivalent value and with opposite polarity to the variation with time detected in the output signal (Vs) of the amplifier (2), with the condition that if said variation with time is greater than a maximum value (Vcmax), the value of the compensating voltage will be equal to said maximum value (Vcmax).

11. A method for the detection of storms comprising the steps of:

monitoring the output signal (Vs) of a device; and determining the presence of a storm based on the development of said output signal, wherein each device comprises a first conductive element (1);

an amplifier (2) with an input (2*a*) connected to the first conductive element (1) to receive an input signal (Ve) in said input (2*a*), said signal being indicative of the field voltage of an electrostatic field to which the first conductive element (1) is exposed, the amplifier (2) being configured as charge amplifier so that it produces, at one output (2*b*) of the amplifier (2), an output signal (Vs) with a value which corresponds to the value of the input signal (Ve) integrated over time;

an electronic control device (3) which has an input (3*a*) connected to the output (2*b*) of the amplifier (2), to receive said output signal (Vs);

a second conductive element (4) located near to the first conductive element (1);

the electronic control device having an output (3*b*) connected to said second conductive element (4) in order to apply a compensating voltage (Vc) to said second conductive element (4), to establish a compensating electrostatic field that affects the first conductive element (1);

the electronic control device further comprising:

means (31) to detect the output signal (Vs) of the amplifier;

means (32) for measuring a variation in time of said output signal (Vs) of the amplifier at regular time intervals;

means (33) to generate and apply periodically to the output (3*b*) of the electronic control device (3), the compensating voltage (Vc) with an equivalent value and with opposite polarity to the variation with time detected in the output signal (Vs) of the amplifier (2), with the condition that if said variation with time is greater than a maximum value (Vcmax), the value of the compensating voltage will be equal to said maximum value (Vcmax).

* * * * *